(12) United States Patent
Wang et al.

(10) Patent No.: US 6,204,550 B1
(45) Date of Patent: Mar. 20, 2001

(54) METHOD AND COMPOSITION FOR REDUCING GATE OXIDE DAMAGE DURING RF SPUTTER CLEAN

(75) Inventors: Zhihai Wang; Wei-Jen Hsia, both of Sunnyvale; Wilbur Catabay, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/251,702

(22) Filed: Feb. 17, 1999

Related U.S. Application Data

(62) Division of application No. 08/976,033, filed on Nov. 21, 1997, now Pat. No. 5,994,211.

(51) Int. Cl.$^7$ ................................................ H01L 23/495
(52) U.S. Cl. ...................... 257/622; 257/625; 257/774; 257/775
(58) Field of Search .................................. 257/622, 623, 257/625, 758, 750, 764, 774, 775

(56) References Cited

U.S. PATENT DOCUMENTS

| | | |
|---|---|---|
| 3,816,185 | 6/1974 | Toledo et al. ..................... 148/6.24 |
| 3,868,217 | 2/1975 | Hollingshad ..................... 21/2.7 A |
| 4,076,575 | 2/1978 | Chang . |
| 4,343,660 | 8/1982 | Martin ............................... 148/6.14 |
| 4,362,597 | * 12/1982 | Fraser et al. . |
| 4,497,713 | 2/1985 | Geiger ................................. 210/699 |
| 4,544,445 | 10/1985 | Jeuch et al. . |
| 4,624,864 | 11/1986 | Hartmann . |
| 4,649,025 | 3/1987 | Hwa et al. ............................ 442/15 |
| 4,663,053 | 5/1987 | Geiger ................................. 210/699 |
| 4,954,218 | * 9/1990 | Okumura et al. . |
| 5,017,029 | 5/1991 | Andou et al. ........................ 400/237 |
| 5,266,516 | 11/1993 | Ho . |
| 5,533,635 | 7/1996 | Man ....................................... 216/67 |
| 5,565,708 | * 10/1996 | Ohsaki et al. . |
| 5,712,194 | 1/1998 | Kanazawa . |
| 5,714,418 | 2/1998 | Bai et al. . |
| 5,929,526 | * 7/1999 | Srinvasan et al. . |

OTHER PUBLICATIONS

Presentation slides at CMPUG Annual Symposium, entitled "Alumina–SiO$_2$ Interactions Under Conditions Relevant to Post–CMP Cleaning of W–Slurries", by I.J. Malik, R. Emami, C. Raghunath, and S. Raghavan of OnTrak Systems, Inc., Milpitas, California, Dec. 1996.

* cited by examiner

*Primary Examiner*—Sheila V. Clark
(74) *Attorney, Agent, or Firm*—Beyer Weaver & Thomas, LLP

(57) ABSTRACT

Provided is a method and composition for RF sputter cleaning of contact and via holes which provides substantially uniform charge distribution in the holes and minimizes electron shadowing. This is accomplished by isotropically depositing, such as by PVD, a layer of conductive material at the wafer surface surrounding a hole and down the sides of the hole. Isotropic deposition is such that in high aspect ratio trenches and holes deposition is heaviest at the top and minimal at the bottom (due to the deposition shadowing effect). The deposited conductive material is preferably a metal that is also used as a liner in the holes prior to depositing the plug material. The conductive material provides path for negative charge otherwise accumulating at the top of a hole during RF sputter cleaning to reach the bottom of the hole and thereby prevents accumulations of charge of one polarity in and around the hole. Thus, the stress on the gate oxide caused by conventional RF sputtering, described above, is relieved.

11 Claims, 4 Drawing Sheets

METHOD AND COMPOSITION FOR REDUCING GATE OXIDE DAMAGE DURING RF SPUTTER CLEAN

This is a Divisional application of prior application Ser. No. 08/976,033 filed on Nov. 21, 1997, now U.S. Pat. No. 5,994,211.

BACKGROUND OF THE INVENTION

This invention relates generally to semiconductor processing, and in particular to contact and via holes. More specifically, the invention relates to a method of reducing gate oxide damage due to radio frequency (RF) sputter cleaning of high aspect ratio contact and via holes.

In semiconductor processing, conductive elements in non-successive layers of the semiconductor wafer may be connected by contacts or vias. A via is a connection between two metallic features in different layers of a semiconductor wafer (a "vertical" connection). A contact is a connection between metallic and non-metal conducting or semiconducting (such as silicon, polysilicon, or silicide) features in different layers of a semiconductor wafer.

A contact or via is typically formed by depositing a conductive material in a hole etched through a layer of dielectric between the two layers to be connected (an inter-layer dielectric ("ILD"). An example of a typical process for forming a contact is shown in FIGS. 1A–D. FIG. 1A shows a portion of a semiconductor wafer 100 having a feature in a semiconductor layer 102, for example a polysilicon floating gate, covered by an ILD 104, for example silicon dioxide ($SiO_2$). FIG. 1B shows a contact hole 106 etched in the ILD 104, for instance by plasma etching or reactive ion etching (RIE), using conditions well known in the art. Such a hole typically has a high aspect ratio, for example a depth twice its diameter or width (2:1 aspect ratio). A typical via hole in a 0.35 $\mu$m semiconductor device size environment may be about 500 to 1000 nm deep by about 200 to 500 nm in diameter.

In order to provide the best possible connection to the semiconductor layer 102, the contact hole 106 is then typically subjected to a cleaning procedure to remove the native oxide which forms on the semiconductor layer 102 and any polymer residue remaining from the etch chemistry which forms the hole 106. This cleaning is typically accomplished by a wet etch process whereby a selectively corrosive liquid, such as hydrofluoric acid (HF) is dispensed into the hole and then removed. The cleaned contact hole 106 may be coated with a deposited liner material 110, such as tungsten nitride (WN), titanium nitride (TiN) or titanium tungsten (TiW). The liner material 110 is typically anisotropically deposited, for example, by physical vapor deposition (PVD). The liner 110 provides a good base for deposition of a metal plug 108, typically tungsten (W), deposited by chemical vapor deposition (CVD), as shown in FIG. 1C. It also provides a barrier to prevent corrosion or diffusion of metal ions from the contact or via metal plug 108 into the layer to be connected 102.

Next, the wafer surface is typically planarized, for instance by chemical mechanical polishing (CMP), before a metal layer 112, typically aluminum or an aluminum alloy, such as aluminum copper (AlCu), is deposited over the ILD 104 and plug 108 and patterned, as shown in FIG. 1D. The plug 108 provides an electrical connection (contact) between the semiconductor layer 102 and the metal layer 112 through the ILD 104. Such a process is also applicable to the formation of vias where both layers being connected are metallic.

FIG. 2 depicts a portion of a conventional semiconductor wafer showing an example of the context in which contacts and vias may be used. The wafer 200 includes a semiconductor substrate 202, typically composed of single crystal silicon (Si). The top of the substrate 202 includes doped CMOS transistor source 204 and drain 206 regions separated by a gate oxide 208 region, usually about 35 to 100 Å in thickness. The transistor gate 210, typically composed of doped polysilicon, is deposited above the gate oxide 208. The particular transistor shown in FIG. 2 was formed using a silicide process, such as are well known in the art. Silicide (e.g., WSi, $TiSi_2$ or $CoSi_2$) layers 212, 214 and 216 cover the source 204, drain 206, and gate 210 regions, respectively, to improve their conductivity. Spacers 218 separate the gate 210 for the source 204 and drain 206 to prevent shorts.

The transistor region is covered by a first layer of ILD 220, on which a first metal layer 230 is deposited and patterned. The first metal layer 230 and floating gate 210, 216 are connected by a contact 225 (including liner 226). The first metal layer is in turn covered by a second layer of ILD 240 (also referred to as inter metal dielectric ("IMD") where the dielectric separates two metal layers), on which a second metal layer 250 is deposited and patterned. The first 230 and second 250 metal layers are connected by a via 235 (including liner 236).

Attention has recently been given to the improvement of the process of cleaning contact or via holes prior to deposition of contact and via materials in order to minimize contact and via resistance. Conventional wet etch cleaning processes have drawbacks including that the etching liquid does not always reach the base of the high aspect ratio contact and via holes, and even when it does, it is not always successful in removing contaminants from the holes. Another way to clean contact and via holes, which appears to provide improved results is radio frequency (RF) sputtering. However, plasma induced gate oxide damage may result form such conventional RF sputtering.

FIG. 3 shows a portion of a semiconductor wafer 300 having a substrate 301, a gate oxide layer 302, a polysilicon gate layer 303, an ILD layer 304, and a contact hole 306. In RF sputtering, the wafer 300 may be biased to a low potential, for example about −50 to −500 V (typically about −200 V) while a high voltage plasma of argon ions ($Ar^+$) 310 and electrons 312 is produced by treating argon gas with RF energy above the wafer surface. The following RF process conditions are typically used: the power may range from about 20 to 700 W; the argon pressure may range from about 0.05 mtorr to 25 mtorr; the etch time may range from about 0.5 to 100 s.

The argon ions 310 and electrons 312 from the plasma produced by the RF energy are drawn into the hole 306 by the low potential. The electrons 312 tend to move randomly, while the argon ions 310 move more directionally. As a result, a non-uniformity tends to develop in the plasma as the top portion 308 of the hole 306 and the wafer surface 305 surrounding the hole 306 become negatively charged by the impact of electrons 312. The electrical field due to this negative charge produces an electron shadowing effect whereby electrons 312 subsequently moving in the direction of the hole 306 are repelled. Thus, the number of electrons 312 reaching the bottom 307 of the hole 306 is greatly reduced. Meanwhile, a much greater number of the positively charged directional argon ions 310 reach the bottom 307 of the hole 306. The negative charge at the top 308 of the hole 306 is unable to travel through the isolation dielectric layer 304 to neutralize the positive charge at the bottom 307 of the hole 306. As a result, an excess of positive charge develops in the bottom 307 of the hole 306.

The local electrical potential built-up by the unbalanced distribution of charges at the top 308 and bottom 307 of the hole 306 may degrade the gate oxide 302. The accumulated charge in the bottom of via hole 306 may be carried through the gate 302 to the gate/gate oxide interface (not shown in FIG. 3). Typical gate oxides include native defects at the substrate/oxide interface and in the body of the gate oxide. These defects do not cause a problem in normal circumstances, however, an accumulation of a large amount of charge of one polarity adjacent to the gate oxide 302, such as occurs with conventional RF sputter cleaning of contact holes, causes migration of these defects which can lead to degradation of the integrity of the gate oxide and ultimately to its failure. Such problems may also be caused in the cleaning of via holes where accumulated charge may flow from the bottom of the via hole through the underlying metal layer and contact to the gate and gate oxide, for example in the wafer structure show in FIG. 2.

Accordingly, a RF sputter clean process which does not produce an unbalanced charge distribution in contact and via holes would be desirable.

SUMMARY OF THE INVENTION

To achieve the foregoing, the present invention provides a composition and process for RF sputter cleaning of contact and via holes which provides substantially uniform charge distribution in the holes and minimizes electron shadowing. This is accomplished by isotropically depositing, such as by PVD, a layer of conductive material at the wafer surface surrounding a hole and down the sides of the hole. Isotropic deposition is such that in high aspect ratio trenches and holes deposition is heaviest at the top and minimal at the bottom (due to the deposition shadowing effect). The deposited conductive material is preferably a metal that is also used as a liner in the holes prior to depositing the plug material. The conductive material provides path for negative charge otherwise accumulating at the top of a hole during RF sputter cleaning to reach the bottom of the hole and thereby prevents accumulations of charge of one polarity in and around the hole. The repulsion of electrons is also thereby substantially eliminated, allowing more electrons to reach the bottom of the hole directly. Thus, the stress on the gate oxide caused by conventional RF sputtering, described above, is relieved.

The invention exploits the normally disadvantageous deposition shadowing effect of isotropic deposition to provide a desired minimal deposition of conductive material in the bottom of a hole so that it does not interfere with the cleaning process. The conductive material need not be removed following completion of cleaning since it preferably is composed of the same material used in the hole liner and becomes incorporated into the subsequently deposited liner layer.

These and other features and advantages of the present invention are described below with reference to the drawings.

DETAILED DESCRIPTION OF THE PREFERRED EMBODIMENTS

As described more fully below, the present invention provides a composition and process for RF sputter cleaning of contact and via holes which provides substantially uniform charge distribution in the holes and minimizes electron shadowing. This is accomplished by isotropically depositing, such as by PVD, a layer of conductive material at the wafer surface surrounding a hole and down the sides of the hole. Isotropic deposition is such that in high aspect ratio trenches and holes deposition is heaviest at the top and minimal at the bottom (due to the deposition shadowing effect). The deposited conductive material is preferably a metal that is also used as a liner in the holes prior to depositing the plug material. The conductive material provides path for negative charge otherwise accumulating at the top of a hole during RF sputter cleaning to reach the bottom of the hole and thereby prevents accumulations of charge of one polarity in and around the hole. The repulsion of electrons is also thereby substantially eliminated, allowing more electrons to reach the bottom of the hole directly. Thus, the stress on the gate oxide caused by conventional RF sputtering, described above, is relieved.

In the following description, numerous specific details are set forth in order to fully illustrate preferred embodiments of the present invention. It will be apparent, however, that the present invention may be practiced without limitation to some specific details presented herein. For example, while the description below refers primarily to contact holes, the invention is also applicable to via holes and may further be applied to the cleaning of other trench elements during semiconductor wafer processing, such as trenches in the local interconnect.

Figure 1A:
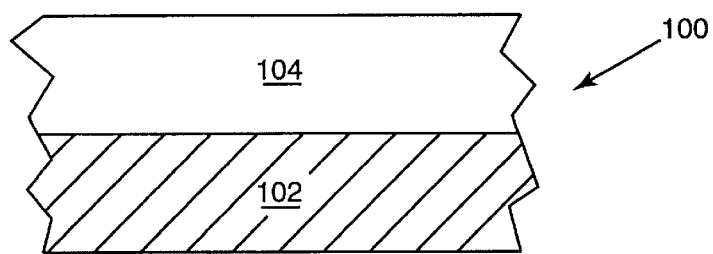
FIGS. 1A–D depict cross-sectional views of stages in the formation of a contact in a semiconductor wafer.
Figure 1B:
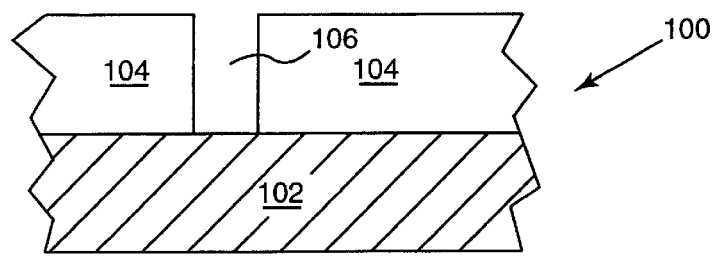
Figure 1C:
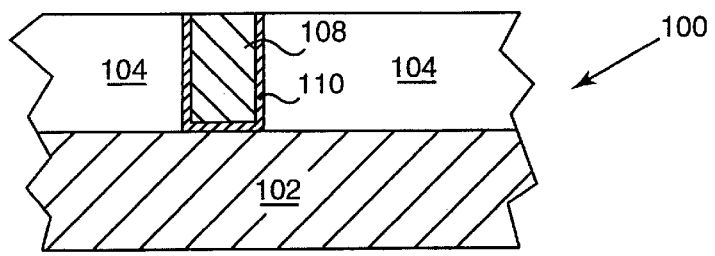
Figure 1D:
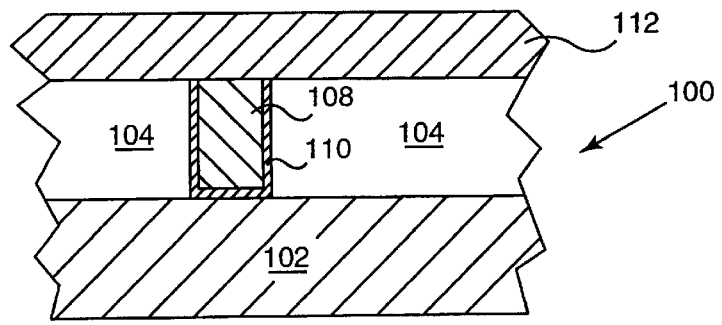
Figure 2:
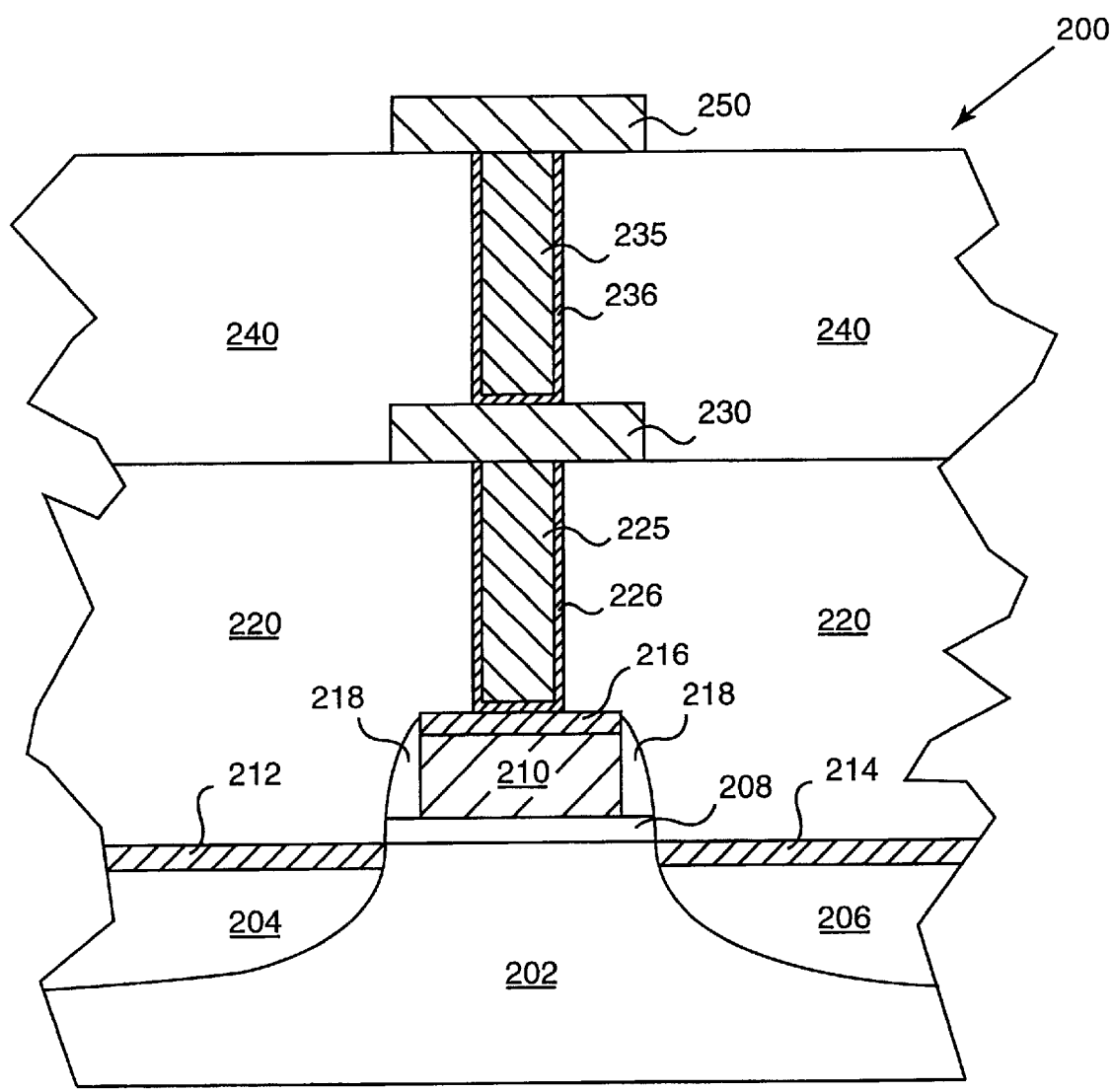
FIG. 2 depicts a cross-sectional view of a portion of a conventional semiconductor wafer showing an example of the context in which contacts and vias may be used.
Figure 3:
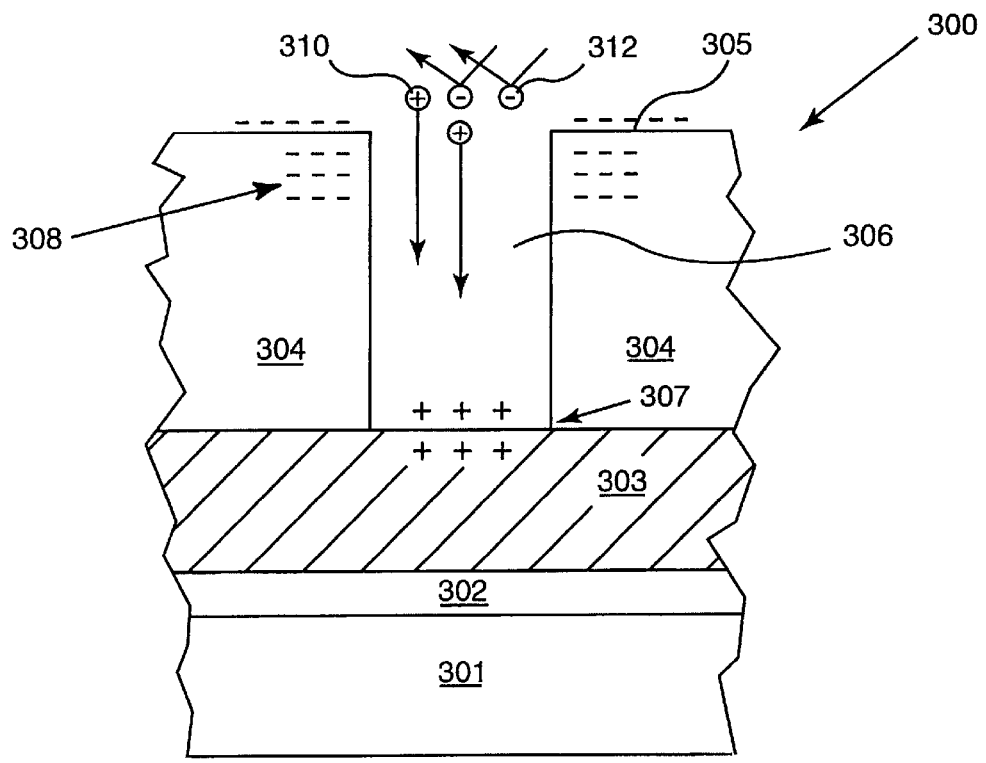
FIG. 3 depicts a cross-sectional view of a portion of a conventional semiconductor wafer illustrating the non-uniform charge distribution and electron shadowing effects produced by conventional RF sputter cleaning of contact and via holes.
Figure 4:
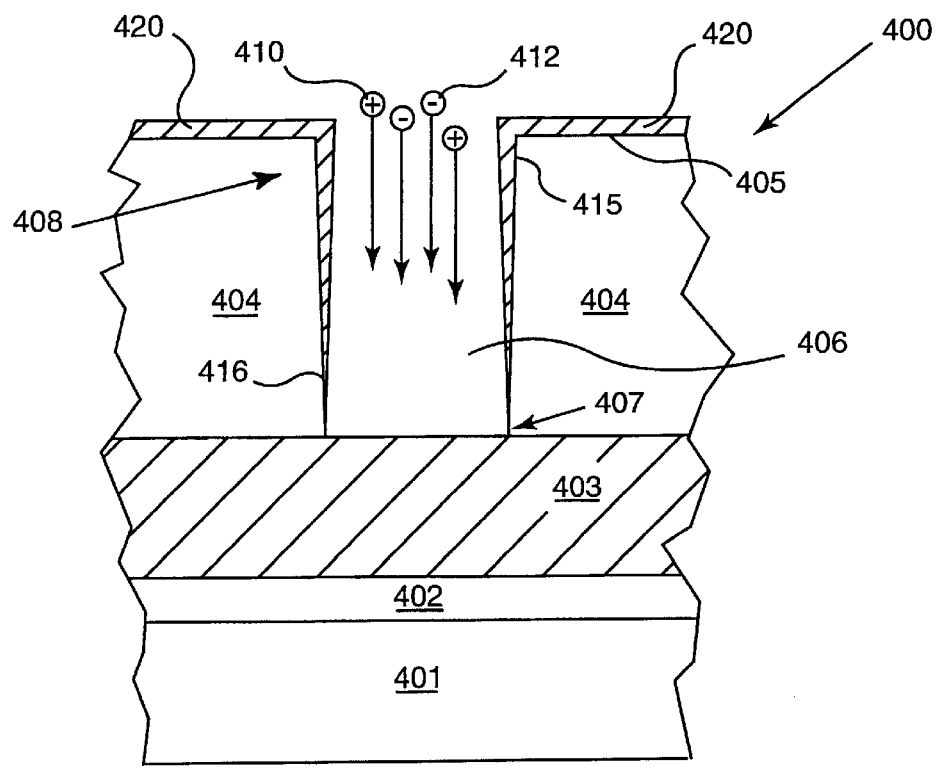
FIG. 4 depicts the same cross-sectional view of a portion of a semiconductor wafer as shown in FIG. 3, illustrating a composition and RF sputter cleaning process according to a preferred embodiment of the present invention.

Referring to FIG. 4, the same cross-sectional view of a portion of a semiconductor wafer as shown in FIG. 3 is shown. FIG. 4 shows a portion of a semiconductor wafer 400 having a substrate 401, a gate oxide layer 402, a polysilicon gate layer 403, an ILD layer 404, and a contact hole 406. In addition, according to a preferred embodiment of the present invention, after the contact hole 406 etching is complete, and before the RF sputter cleaning process begins, a layer of conductive material 420 may be isotropically deposited, for example by PVD, over the field area surrounding the hole at the wafer surface 405 and most of the side walls 415, 416 of the contact hole 406.

This aspect of the present invention exploits the normally disadvantageous deposition shadowing effect which may result from PVD of a material in a restricted area. The isotropic nature of PVD and the high aspect ratio deposition substrate provided by the contact hole 406 causes a deposition shadowing effect which results in substantial coverage at the wafer surface 405 and hole side walls 415 near the top of the hole 408, but progressively reduced coverage on the lower side walls 416 and the bottom of a hole 407 due to obstruction of deposition by the high facing side walls.

The conductive layer 420 may be preferably composed of PVD Ti or TiN, particularly where the metal plug is composed of aluminum or an aluminum alloy. The conductive layer 420 may also be composed of PVD Ta, TaN, WN or TiW, for example, particularly where the metal plug is composed of copper, or other suitable materials. The conductive layer material is preferably selected to provide an effective diffusion barrier for the plug material. Preferably the conductive layer will have a thickness of about 20 to 1000 Å; more preferably about 50 to 300 Å, and most preferably about 150 Å at the wafer surface 305, gradually reducing to preferably about 50 to 0 Å more preferably about 20 to 0 Å, and most preferably about 0 Å at the bottom of the hole 406 due to PVD deposition shadowing. PVD process conditions for the conductive layer deposition may be as follows: power about 100 W to 15 kW; pressure about 0.1 mtorr to 200 mtorr.

As described above, in RF sputtering, the wafer 400 may be biased to a low potential, for example about −50 to −500 V (typically about −200 V) while high voltage plasma of argon ions ($Ar^+$) 410 and electrons 412 is produced by treating argon gas with RF energy above the wafer surface. The following RF process conditions may be used: the power may range from about 20 to 700 W; the argon pressure may range from about 0.05 mtorr to 25 mtorr; the etch time may range from about 0.5 to 100 s.

As in the conventional process, the argon ions 410 and electrons 412 from the plasma produced by the RF energy are drawn by the low potential, and the electrons 412 tend to impact at the surface 405 and near the top 408 of the hole 406, while the argon ions 410 reach the bottom 307 of the hole 306. However, the presence of the conductive layer 420 provides a path for electrons to flow from the top 408 of the hole and the wafer surface 405 surrounding the hole 406 to the bottom 407 of the hole 406. The repulsion of electrons is also thereby substantially eliminated, allowing more electrons to reach the bottom of the hole directly. As a result, positive charges resulting from argon ion 412 impact in the bottom 407 of the hole 406 may be neutralized by the electrons flowing from the top 408 of the hole 406 through the conductive layer 420 and more electrons directly impacting the bottom 407 of the hole 406. Therefore, the conductive layer 420 substantially reduces the electron shading effect and the effect of the non-uniform plasma environment associated with conventional RF sputter cleaning, and thus reduces the resulting plasma-induced damage to the gate oxide 402.

Due to the anisotropic etch nature of the RF sputter clean process, the bottom 407 of the hole 406, where little or no conductive layer 420 is deposited, may be cleaned while the conductive layer 420 which coats the rest of the hole 406 and surrounding wafer surface 405, maintains the charge balance. Generally, the conductive layer deposition and RF sputter clean processes are preferably optimized so that the conductive layer's coverage will be substantially maintained during entire cleaning process. The remaining conductive material need not be removed following completion of cleaning since it preferably is composed of the same material used in the hole liner and becomes incorporated into the subsequently deposited liner layer (not shown). Following deposition of the liner, the remainder of the hole may be filled with conductive material (not shown), preferably a metal, that is compatible with the liner material, as described above.

Figure 5:
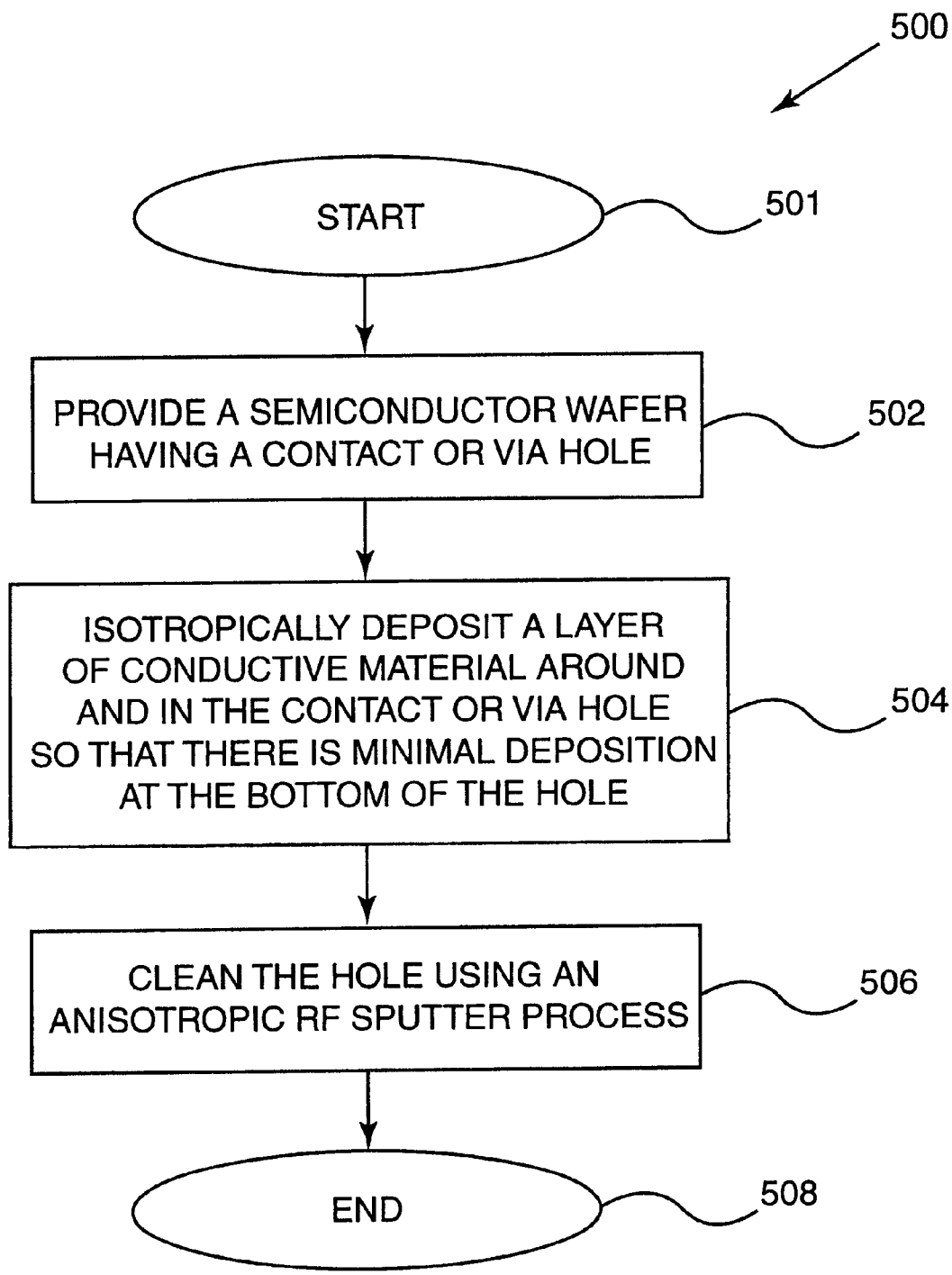
FIG. 5 depicts a flow chart showing the steps of a method of RF sputter cleaning of contact and via holes in accordance with a preferred embodiment of the present invention.

FIG. 5 shows a flow chart 500 of a preferred method of cleaning a contact or via hole, in accordance with a preferred embodiment of the present invention. The method 500 begins at 501, and at a step 502 a semiconductor wafer having a contact or via hole in its surface is provided. At a step 504, a layer of conductive material is isotropically deposited on the wafer surface surrounding the hole and in the hole. Preferably, conductive material is also suitable as a liner for the hole, for example Ti or TiN. A preferred deposition method for the material is by sputtering (PVD). Such isotropic deposition in a high aspect ratio holes result in decreased deposition towards the bottom of the hole.

At a step 506, the hole is cleaned using an RF sputter cleaning process, such as described above. This process is preferably optimized so that the conductive layer's coverage will be substantially maintained during entire cleaning process. The process ends at 508.

As described above, the remaining conductive material need not be removed following completion of cleaning since it preferably is composed of the same material used in the hole liner and becomes incorporated into the subsequently deposited liner layer (not shown). Following deposition of the liner, the remainder of the hole may be filled with conductive material (not shown), preferably a metal, that is compatible with the liner material.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A composition for balancing charge during RF sputter cleaning of a hole for electrically connecting two conductive features in non-successive layers of a semiconductor wafer, comprising:

a hole in a dielectric surface layer of a semiconductor wafer; and an isotropically deposited layer of electrically conductive material in said hole, said layer gradually decreasing in thickness to about 50 to 0 Å at the bottom of said hole.

2. The composition of claim 1 wherein said hole is a contact hole.

3. The composition of claim 1 wherein said hole is a via hole.

4. The composition of claim 1 wherein said hole has about a 2:1 aspect ratio.

5. The composition of claim 1 wherein said electrically conductive material provides a barrier to diffusion of metal ions.

6. The composition of claim 1 wherein said electrically conductive material is deposited by physical vapor deposition.

7. The composition of claim 1 wherein said electrically conductive material comprises materials selected from the group consisting essentially of Ti, TiN, Ta, TaN, WN and TiW.

8. The composition of claim 1 wherein said electrically conductive material has a thickness of about 20 to 1000 Å at the wafer surface, gradually reducing to about 50 to 0 Å at the bottom of the hole.

9. The composition of claim 8 wherein said electrically conductive material has a thickness of about 50 to 300 Å at the wafer surface, gradually reducing to about 20 to 0 Å at the bottom of the hole.

10. The composition of claim 9 wherein said electrically conductive material has a thickness of about 150 Å at the wafer surface, gradually reducing to about 0 Å at the bottom of the hole.

11. The composition of claim 1 wherein coverage of the electrically conductive layer from the top the bottom of the hole is substantially maintained during cleaning.

* * * * *